United States Patent [19]
Yamaguchi et al.

[11] Patent Number: 4,607,216
[45] Date of Patent: Aug. 19, 1986

[54] APPARATUS FOR MEASUREMENT BY DIGITAL SPECTRUM ANALYZER

[75] Inventors: Takahiro Yamaguchi; Masayuki Ogawa, both of Gyoda; Toshiharu Kasahara, Okegawa, all of Japan

[73] Assignee: Takeda Riken Kogyo Kubushikikaisha, Tokyo, Japan

[21] Appl. No.: 654,132

[22] Filed: Sep. 25, 1984

[30] Foreign Application Priority Data

Sep. 28, 1983 [JP] Japan ................. 58-181641

[51] Int. Cl.⁴ ............................................. G01R 23/16
[52] U.S. Cl. .................................. 324/77 B; 364/576; 324/57 PS
[58] Field of Search .............. 324/77 B, 77 C, 77 CS, 324/77 R, 130, 57 PS, 57 SS, 58 A, 58 B; 364/484, 485, 576; 371/20

[56] References Cited
U.S. PATENT DOCUMENTS 4,149,122  4/1979  Parato ..................... 324/130
4,517,512  5/1985  Petrich et al. ............ 324/158 F
4,539,518  9/1985  Kitayoshi ................. 324/77 B Primary Examiner—Michael J. Tokar
Attorney, Agent, or Firm—Staas & Halsey

[57] ABSTRACT

A frequency range of measurement is divided into a plurality of regions. For each region a test signal suitable for measurement of the region is generated independently, and the test signal is supplied to a device under test. The output of the device under test is converted by an AD converter into a digital signal, which is then subjected to fast Fourier transform. For each region the sensitivity of the AD converter is set for optimal conversion of the signal level at its input side by the converter, and then the fast Fourier transform is carried out. On the basis of the sensitivity set for one of the regions, the magnitude of the fast Fourier transform output in each of the other regions is corrected according to the sensitivities set for the other regions.

13 Claims, 19 Drawing Figures

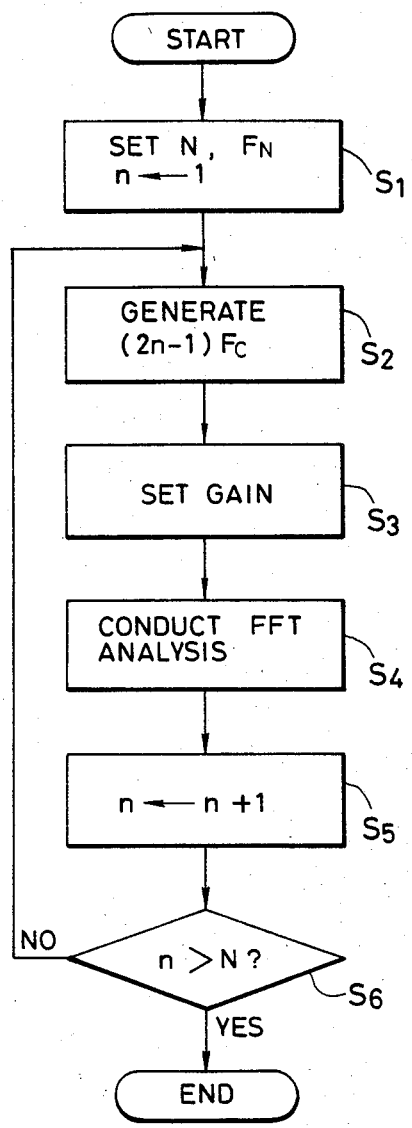

APPARATUS FOR MEASUREMENT BY DIGITAL SPECTRUM ANALYZER

BACKGROUND OF THE INVENTION

The present invention relates to a method for measurement through the use of a digital spectrum analyzer, according to which a test signal is supplied to a device under test and the output signal therefrom is converted into a digital signal and then subjected to fast Fourier transform, thereby measuring the spectral structure of the transfer function and the output signal of the device under test.

According to a conventional digital spectrum analyzer, as disclosed in, for example, U.S. Pat. No. 3,988,669 (issued on Oct. 26, 1976), a random noise is used as a test signal and the frequency range of measurement is measured at one time, or a sine-wave signal of a single frequency is generated, the frequency of which is sequentially changed to sweep the entire frequency range of measurement, and for each frequency change, a fast Fourier transform is carried out.

The measurement by the use of noise is short in time but poor in accuracy. In particular, a resonance or antiresonance portion in the transfer function characteristic of the device under test, where the transfer function undergoes an abrupt change with frequency change, becomes dull, making accurate measurement impossible. On the other hand, in the case of sequentially changing the frequency of the single sine-wave signal, the portion of abrupt variations in the transfer function can also be measured faithfully, but this method is very time-consuming.

In the prior art, prior to the measurement, the input level of an AD converter for the input signal is set by selecting a suitable gain (or attenuation), which is commonly referred to as range setting (sensitivity setting), so that the input level of the AD converter assumes an optimum value for effectively utilizing its conversion range, and the measurement is performed at the thus set sensitivity over the entire frequency range of measurement. With this method, however, in the case where the level of a spectrum in the frequency range of measurement undergoes relatively great variations (that is, when the dynamic range is large), no accurate measurement can be achieved. That is, there are the possibilities that the high-level portion in the frequency range of measurement is saturated to produce a distortion and, in the low-level portion, that the number of effective bits in its converted digital signal output is small, resulting in lowered accuracy of measurement.

Moreover, according to the prior art, fast-Fourier-transformed line spectra are equally spaced in frequency over the entire frequency range of measurement. On account of this, measurement for the high-frequency region can be achieved with high resolution for frequency, but frequency resolution in the low-frequency region is low.

SUMMARY OF THE INVENTION

It is therefore an object of the present invention to provide a method for measurement by a digital spectrum analyzer which permits measurement with high accuracy even when level variations are large throughout the entire frequency range of measurement.

Another object of the present invention is to provide a method for measurement by a digital spectrum analyzer according to which measurement can be achieved with high accuracy and in a short time even if a variation in a transfer function relative to a frequency change is abrupt.

Another object of the present invention is to provide a method for measurement by a digital spectrum analyzer which does not produce a large difference in frequency resolution throughout the entire frequency range of measurement.

Yet another object of the present invention is to provide a digital spectrum analyzer which permits attainment of the abovesaid objects.

According to the present invention, the frequency range of measurement is divided into a plurality of regions, for each of which a test signal is generated, and the output signal of a device under test and, if necessary, its input signal are subjected to fast Fourier transform. Accordingly, it is possible to use a test signal fit for the characteristic of each region. For example, for a region in which the transfer function changes abruptly, measurement is performed by using, as the test signal, a single sine-wave signal, the frequency of which signal is swept within a small sweep width at a relatively low speed, by which the abrupt-change state can be measured accurately. Measurement for a region in which the transfer function changes slowly can be achieved, without decreasing the accuracy of measurement and in a short time, by using a wide-band test signal which covers the band of the region, such as noise or a multiple sine-wave signal, or a frequency-swept sine-wave signal which sweeps a wide frequency range at a relatively high speed.

Furthermore, by measuring through the use of independent test signals for the individual frequency regions, and by effecting the sensitivity setting to make the input level of an AD converter optimal for each region, it is possible to perform measurement at a low level but with high accuracy, and without incurring saturation at a high level, even if the spectrum intensity undergoes relatively great variations throughout the frequency range of measurement, that is, even if the dynamic range is wide. In this case, on the basis of the sensitivity set for one of the regions, the magnitudes of the measured outputs for the other regions are corrected according to the sensitivities set for the respective regions, and the measured results for the entire frequency range of measurement are displayed on a display.

Moreover, such an arrangement is made that the frequency spacing of line spectra obtained by the fast Fourier transform becomes larger for the regions of higher frequencies. By effecting a fast Fourier transform for each of the regions, for example, between the highest frequency $F_N$ of the frequency range of measurement and a frequency $F_N/10$, between frequencies $F_N/10$ and $F_N/100$ and between frequencies $F_N/100$ and $F_N/1000$ so that 400 line spectra are obtained for each region, high-accuracy measurement can be achieved even for a low-frequency region.

BRIEF DESCRIPTION OF THE DRAWINGS

FIG. 8 is a flowchart showing an example of the entire operation of the measuring method using a digital spectrum analyzer according to the present invention;

FIG. 9 is a flowchart showing a part of an example of the stored content of an RAM 64;

DESCRIPTION OF THE PREFERRED EMBODIMENTS

To facilitate a better understanding of the present invention, a description will be given first of the prior art.

Figure 1:
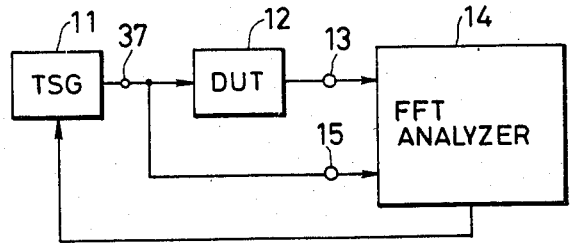
FIG. 1 is a block diagram illustrating an analysis-measurement system using a digital spectrum analyzer.

With a digital spectrum analyzer, as shown in FIG. 1, a test signal from a test signal generator 11 is provided to a device under test 12, the output test signal from which is applied to an FFT (Fast Fourier Transform) analyzer 14, and at the same time, the test signal on the input side of the device under test 12 is also applied to FFT analyzer 14, wherein the both test signals are converted into digital signals and then subjected to fast Fourier transform, obtaining the transfer function of the device under test 12.

Figure 2:
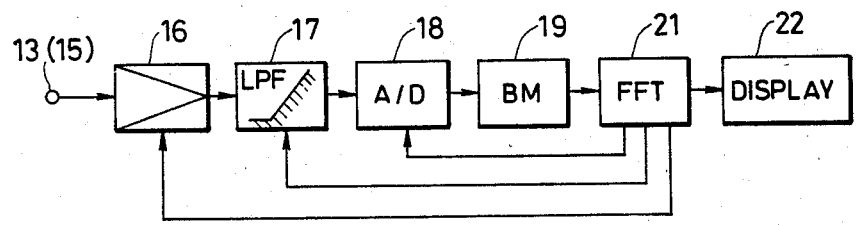
FIG. 2 is a block diagram illustrating in detail a part of an FFT analyzer 14 in FIG. 1.

In the FFT analyzer 14, as shown in FIG. 2, the test signal from an input terminal 13 (or 15) is supplied via a variable gain amplifier 16 to a low-pass filter 17, the output of which is sampled by an AD converter 18 with a fixed period and converted into a digital signal, which is stored in a buffer memory 19. When a certain number of samples, for instance, 1024 samples, are stored in the buffer memory 19, the fast Fourier transform is carried out in an FFT converter 21.

In this case, in order to ensure an efficient conversion in the AD converter 18, that is, in the case of the AD converter 18 converting one sample into, for example, a 10-bit digital signal, what is called range setting for setting the input level to an appropriate value is effected so as to raise the analyzing sensitivity by utilizing the entire range of the 10 bits as much as possible. In other words, when the sample value read out of the buffer memory 19 is too small, the gain of the amplifier 16 is stepped up, whereas if the sample value is too large, the gain of the amplifier 16 is stepped down. Thus, the conversion by the AD converter 18 is optimized.

Figure 3:
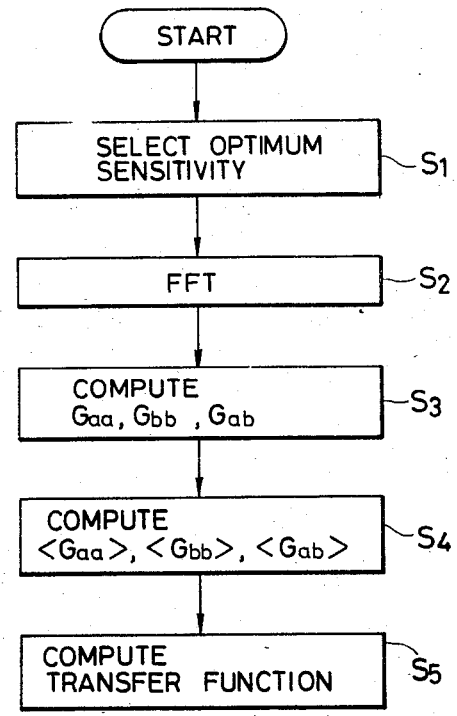
FIG. 3 is a flowchart showing the operation of the FFT analyzer 14.

In the FFT analyzer 21, the sensitivity of the input signal is set in step $S_1$, as shown in the flowchart of FIG. 3. That is, an operation is carried out for setting the input level of the AD converter 18 so as to optimize its conversion, as described above. Then, a fast Fourier transform is carried out, in step $S_2$, for example, for 1024 sample values input into the buffer memory 19 in the abovesaid set state. In step $S_3$, power spectra Gaa and Gbb for the input test signal from the terminal 15 and the output test signal from the terminal 13 and their cross spectrum Gab is calculated. That is, the test signal of a time domain, input from the terminal 15, is converted, by an FFT analysis, into a signal of a frequency domain, and for each frequency component of the signal, the sum of squares of its real part Re(Gai) and imaginary part Im(Gai) is computed, thereby obtaining the power spectrum Gaa. The output test signal from the terminal 13 is also FFT-analyzed and the sum of squares of the real part Re(Gbi) and the imaginary part Im(Gbi) of each frequency component of the resulting signal is calculated, thereby obtaining the power spectrum Gbb. Further, the product of the conjugate of the fast Fourier transform of the input test signal and the conjugate of the fast Fourier transform of the output test signal of the corresponding frequency component, $\{Re(Gai) - jIm(Gai)\} \times \{Re(Gbi) + jIm(Gbi)\}$, is calculated, thereby obtaining the cross spectrum Gab.

Respective test signals are repeatedly input into the buffer memory 19 in a similar manner, and by an operation similar to that described above, each power spectrum and the cross spectrum are obtained a required number of times. In step $S_4$ these spectra are averaged for each frequency component, obtaining average power spectra $<Gaa>$ and $<Gbb>$ and an average cross spectrum $<Gab>$. The transfer function is obtained from these averaged values in step $S_5$. That is, the average cross spectrum $<Gab>$ is divided by the average power spectrum $<Gaa>$ for each frequency.

Figure 4:
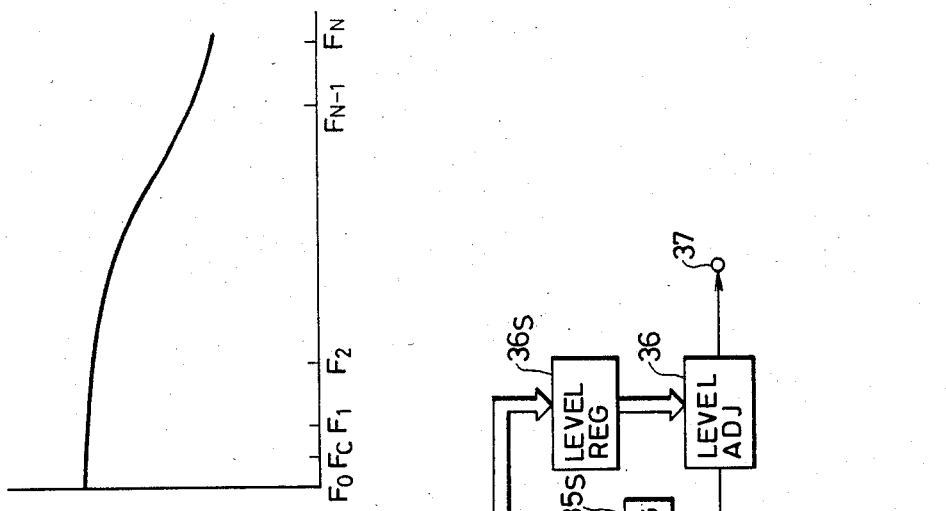
FIG. 4 is a graph showing an example of a transfer function the level of which varies greatly in the frequency range of measurement.

As described above, according to the prior art, the input sensitivity is set only at the beginning of measurement. This introduces such disadvantages as follows. For example, in the event that a measured transfer function curve 23 has substantial variations in amplitude according to frequency, as shown in FIG. 4, the input signal to the analyzer 14 may be too large in the large amplitude portion on the low-frequency side in FIG. 4 and, as a result, the amplifier 16 may be saturated to produce a distortion, making accurate measurement impossible. On the other hand, in the low-level portion on the high-frequency side in FIG. 4, since the number of effective bits in the converted output of the AD converter 18 may be small, the accuracy of measurement is likely to become low. Incidentally, the result of analysis by the FFT analyzer 21 is displayed on a display 22.

Figure 5:
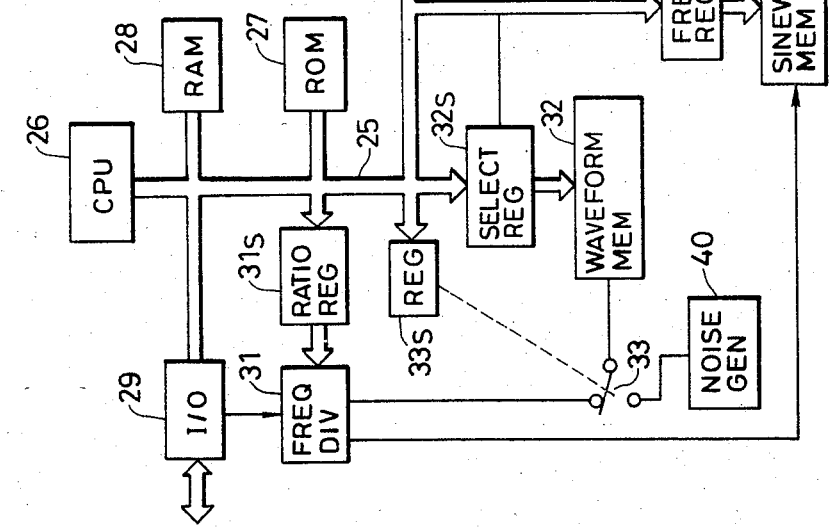
FIG. 5 is a block diagram illustrating an example of a test signal generator 11 in FIG. 1.

In the present invention, for example, the frequency range for measurement, $F_0$ to $F_N$, in FIG. 4 is divided into a plurality of regions, for instance, N equally spaced regions. Test signals for the individual frequency regions are generated independently of one another. As the test signal generator 11 therefor, it is possible to employ such a signal generator, for example, as disclosed in U.S. Pat. application Ser. No. 533,780 (filed Sept. 29, 1983). FIG. 5 shows its outline. Connected to a data bus 25 are a CPU 26, a ROM 27 having stored therein its operating program, a read-write RAM 28 and an input/output circuit 29 connected to the FFT analyzer 14 in FIG. 1. The FFT analyzer 14 provides via the input/output circuit 29 data necessary for the generation of a test signal, i.e. data indicating signal modes of, for example, a noise signal, a multiple sine-wave signal, a single sine-wave signal, a frequency-swept sine-wave signal and so forth, and data indicating maximum and minimum values of the range of frequency to be generated, an amplitude level and, if necessary, a frequency variation width $\Delta F$. Along with these data, a clock of a frequency generally higher than the sampling clock of the AD converter 18 in the FFT analyzer 14 is supplied to the test signal generator for synchronization therewith. This clock is input via the input/output circuit 29 into a frequency divider 31, the frequency dividing ratio of which is set in a frequency dividing ratio setting register 31s connected to the bus 25, by the CPU 26, in accordance with the data input from the input/output circuit 29.

On the other hand, a, waveform memory 32 has stored therein various signal waveforms such as digital values sampled at respective points of the waveform of a multiple sine-wave signal and the waveform of a frequency-swept signal, for example, a swept sine-wave signal whose frequency varies from $F_0$ to $F_1$. It is determined by the content of a waveform selector 32s set by the CPU 26 via the bus 25 which signal waveform should be read out from the waveform memory 32. That is, the waveform selector 32s is set in accordance with the aforesaid signal mode provided from the FFT analyzer 14, and the area of the waveform memory 32 to be read out is chosen by the setting of the selector 32s. The waveform memory 32 is read out by the output of the frequency divider 31, i.e. the clock of the same frequency as and synchronized with the sampling clock of the AD converter 18 (FIG. 2). To this end, the output of the frequency divider 31 is applied via a switch 33 to an address counter in the waveform memory 32, by which the address counter is stepped. It is also possible to output a noise signal from the waveform memory 32 by changing over the switch 33 to supply random pulses from a noise generator 40 to the waveform memory 32.

The signal read out of the waveform memory 32 is provided to a DA converter 34 which yields an analog signal obtained by multiplying its input digital value and an analog input value. The output of the DA converter 34 is applied via a switch 35 to a level adjuster 36. A level is set, by the CPU 26, in a level setting register 36s via the bus 25. That is, the level adjuster 36 is controlled so that its output becomes equal to the set level, i.e. the amplitude provided from the FFT analyzer 14. A test signal of the set level is provided via a terminal 37 to the device under test 12 in FIG. 1. In the case of generating a single sine-wave signal, a sine wave memory 38 is read out by the output clock of the frequency divider 31. The frequency of a sine-wave signal from the sine wave memory 38 is determined by a value which is set, by the CPU 26, in a frequency setting register 38s via the bus 25. The digital sine-wave signal read out of the sine wave memory 38 is converted by a DA converter 30 into analog form, and the analog sine-wave signal is selectively provided via switches 39 and 35 to the level adjuster 36. This sine-wave signal is also selectively applied to the DA converter 34, wherein it is multiplied by the signal read out of the waveform memory 32. This test signal generator is able to generate a test signal of a specified mode in a specified frequency range in accordance with the data supplied from the FFT analyzer 14. The CPU 26 provides data to the 1-bit registers 33s, 35s and 39s to control the switches 33, 35 and 39 in accordance with the data, respectively.

Figure 6:
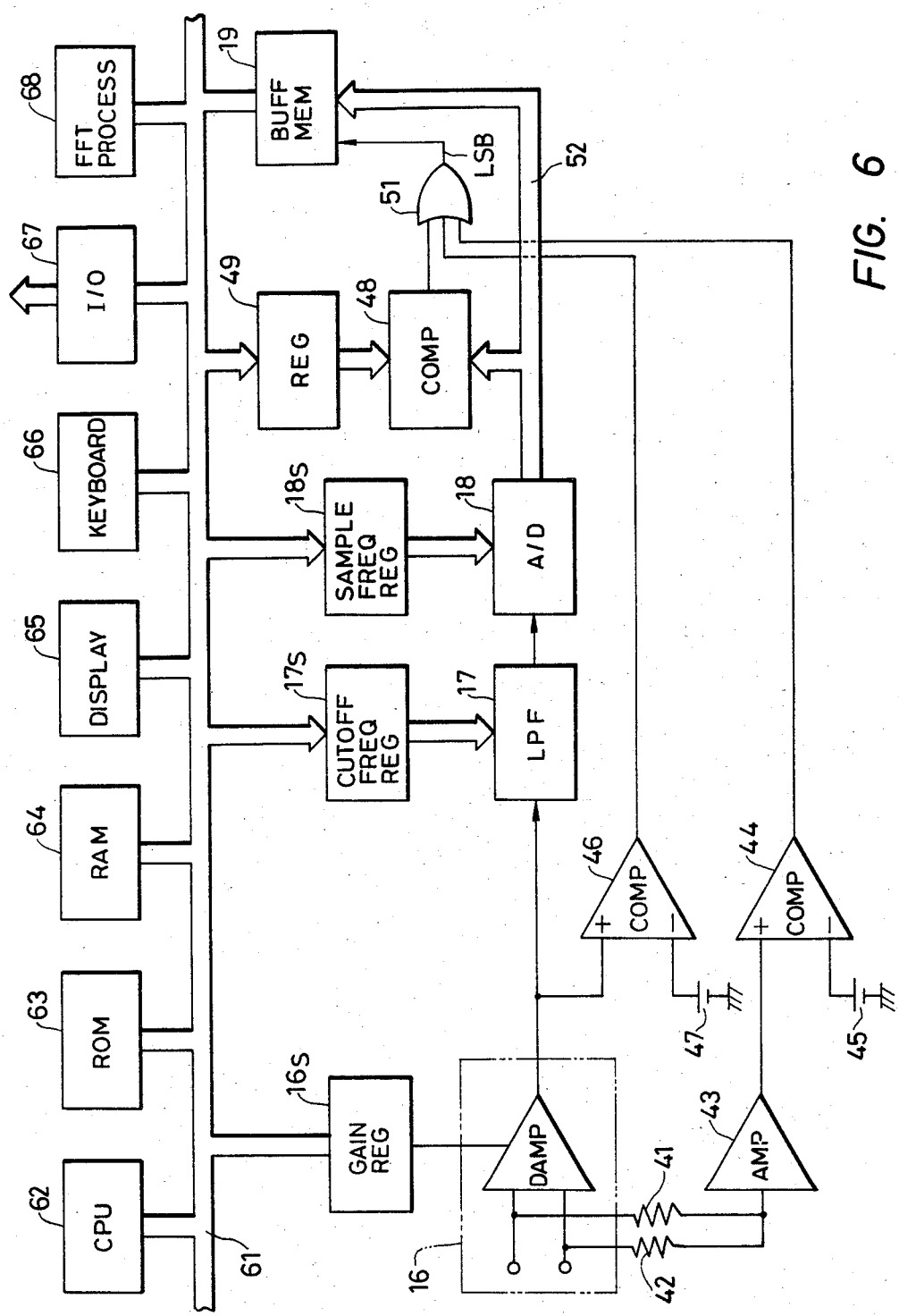
FIG. 6 is a block diagram illustrating an example of the FFT analyzer 14.

The FFT analyzer 14 has such an arrangement, for example, as shown in FIG. 6, in which a data bus 61 has connected thereto a CPU 62, a ROM 63 having stored therein a program, a RAM 64, a display 65, a keyboard 66, an input/output circuit 67 connected to the test signal generator 11 (FIG. 1) and an FFT processor 68. Further, there are also connected to the bus 61 a gain setting register 16s for setting the gain of the amplifier 16, a cutoff frequency setting register 17s for setting the cutoff frequency of the low-pass filter 17, a sampling frequency setting register 18s for setting the sampling frequency of the AD converter 8, a register 49 and the buffer memory 19.

As referred to previously, the input level of the AD converter 18 is controlled so that its converting operation becomes optimal, that is, the most effective conversion data can be obtained. To perform this, the FFT analyzer 14 is so arranged as to detect too high a signal level input thereinto. For example, as shown in FIG. 6, differential input signals to the variable gain amplifier 16 are provided to a common input terminal of an amplifier 43 via resistors 41 and 42, and the output of the amplifier 43 is compared with a reference voltage of a reference power source 45 in a comparator 44. When an in-phase component, i.e. a common mode component, obtained as the output of the amplifier 43 is larger than a certain value, the output of the comparator 44 becomes high-level. Furthermore, the output of the variable gain amplifier 16 is branched and supplied to a comparator 46, wherein it is compared with a reference voltage of a reference power source 47, and when the amplified output has a level higher than a maximum conversion level of the AD converter 18, the output of the comparator 46 becomes high-level. The converted output of the AD converter 18 is branched and supplied to a digital comparator 48, wherein it is compared with a threshold value in the register 49, and in the case of such data that the output of the AD converter 18 overflows, a high-level output is derived from the comparator 48.

The converted output of the AD converter 18 is, for instance, 12-bit, and 12 output bits are connected to 12 higher order input bits of the buffer memory 19. On the other hand, the outputs of the comparators 44, 46 and 48 are ORed by an OR circuit 51, the output of which is connected to the least significant bit of the buffer memory 19. The buffer memory 19 is read out and the output is transferred to the RAM 64 under the control of the CPU 62. In this case, if the input signal level or noise is too large, the least significant bit in the data input into the buffer memory 19 has a logic "1", and when the least significant bit of the output of the buffer memory 19 is a "1", the CPU 62 decides that the input signal is too large, and changes the gain set in the gain setting register 16s, stepping down the gain of the variable gain amplifier 16 by a certain value, for example, 10 db. The selection of a suitable gain represents the selection a suitable input level range.

Figure 7:
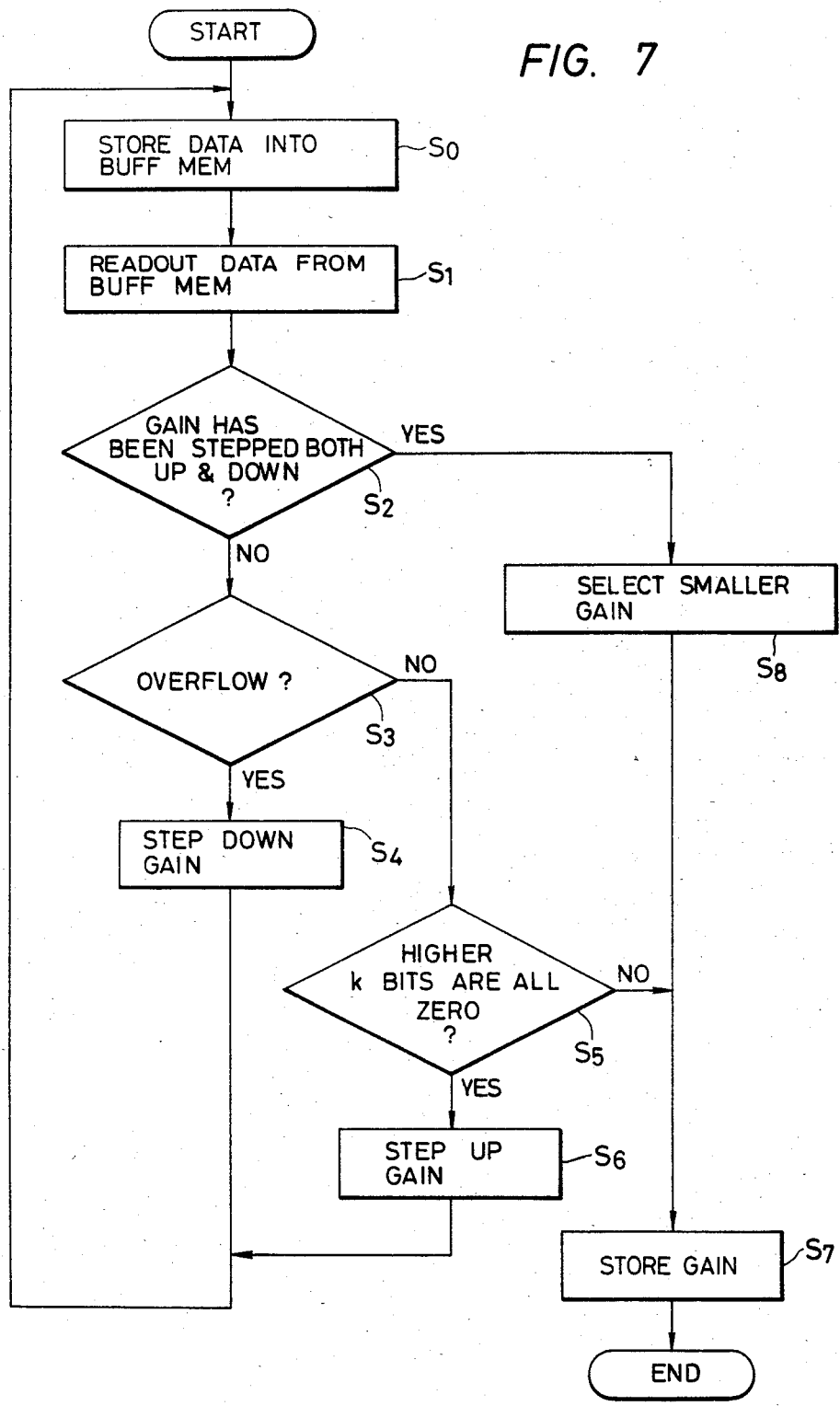
FIG. 7 is a flowchart showing an example of a processing operation for optimizing the level range.

This range setting operation is carried out in such a manner, for example, as shown in FIG. 7. After a predetermined number of data, for instance, 1024 data, have been input into the buffer memory 19 in step $S_0$, the CPU 62 (FFT analyzer 21) reads out a predetermined number of data, for example, 1024 data, from the buffer memory 19 in step $S_1$. In step $S_2$ it is checked whether both operations for stepping up and stepping down the gain of the variable gain amplifier 16 have been carried out until then. In the event that either one or both of the operations have not been effected, it is checked in step $S_3$ whether the least significant bit of each of the read-out data is a "1", that is, whether the data is overflowing. If so, the gain set in the gain setting register 16s is modified in step $S_4$, stepping down the gain of the variable gain amplifier 16 by a certain value, for instance, 10 db. When it is decided in step $S_3$ that no data is overflowing, it is checked, based on the readout data, in step $S_5$ whether anyone of the input levels of the AD converter 18 is too low. This check is performed by deciding that the input level is too low when several high-order k bits of the absolute value of the read-out data are always "0s". If the input level is too low, then the gain set in the gain setting register 16s is modified in step $S_6$ to step up the gain of the variable gain amplifier 16 by a fixed value, for example, 10 db. After each setting of the gain of the variable gain amplifier 16 at either step $S_4$ or $S_6$, the process returns to step $S_0$ and 1024 now data are read into the buffer memory 19 and read out to be checked for an overflow and for too low an input level as mentioned previously, and the gain of the variable gain amplifier 16 is re-set as required. In the case where all the input data do not overflow nor are they too low in level after such an operation is done once or more as required, it is decided in step $S_7$ that the gain of the variable gain amplifier 16 at that time is within an appropriate range, and the gain is stored in a predetermined area of the RAM 64. Sometimes the gain having been stepped down based on the previous level check on input data may happen to be too low for the input data and the operation proceeds to step $S_6$, in which the gain will be stepped up to the original gain value. Then, it is detected in step $S_2$ whether the gain has been stepped in both directions, and since the answer is "yes", the variable gain amplifier 16 is set, in step $S_8$, to the smaller one of the previous two gains.

With such an arrangement, the entire operation is carried out, for example, as shown in FIG. 8. At first, the FFT analyzer 14 is set by the keyboard 66 in an automatic range mode. The signal mode indicating which test signal is to be used is set, and at the same time, the number N of regions into which the frequency range for measurement is divided is set. Furthermore, the content n of a region counter is set to 1, and the highest frequency $F_N$ of the range for measurement is set. As shown in FIG. 9, the signal mode is stored in an area 71 of the RAM 64, and the number of frequency regions N, the count value n of the region counter and the highest frequency $F_N$ are stored in areas 72, 73 and 74 of the RAM 64, respectively. The count value n of the region counter is set to a 1. Moreover, the level (amplitude V) of a test signal to be generated from the test signal generator 11 is set and stored in an area 75 of the RAM 64, and the number p of measurements, i.e. the number of to be averaged, is set and stored in an area 76 of the RAM 64. Thereafter the FFT analyzer 14 is started. In this example, a multiple sine wave is used as the test signal. As the multiple sine wave, there is stored in the waveform memory 32 in FIG. 5 the waveform of a multiple sine wave corresponding to the required number of spectra in the lowest frequency range $F_0=0$ to $F_1$ among the N frequency regions into which the frequency range of FIG. 4 is divided. A signal obtained by multiplying, by (2n−1), the center frequency of the frequency region $F_0$–$F_1$, that is, a value $F_c$ obtained by dividing the highest frequency $F_N$ by 2N, is provided as a center frequency to the test signal generator 11.

In step $S_2$ the signal mode, the frequency region $F_0$–$F_1$, its center frequency $(2n-1)F_c$ and the test signal level V are sent from the FFT analyzer 14 to the test signal generator 11 and stored in the RAM 28.

In the test signal generator 11, on the basis of these data from the FFT analyzer 14, the waveform selector 32s is set to read out the multiple sine wave of the frequency region $F_0$–$F_1$ from the waveform memory 32, and the frequency setting register 38s is set to read out a sine wave of a frequency equal to the center frequency $(2n-1)F_c$ from the sine-wave memory 38. Further, the registers 39s and 35s are set to turn ON the switch 39 and to change over the switch 35 to the side of the DA converter 34. In the initial state, the count value n of the region counter is a 1 and the frequency of the sine wave from the sine-wave memory 38 is $F_c$. The signal which is read out from the waveform memory 32 is the multiple sine wave of the frequencies $F_0$ to $F_1$, and this signal is supplied to the DA converter 34, wherein it is converted into an analog multiple sine-wave signal of the frequency components $F_0$ to $F_1$, which is provided via the terminal 37 to the device under test 12.

In this way, the test signal is generated, and the input test signal and the output test signal having passed through the device under test 12 are both provided to the FFT analyzer 14, wherein by such a process as shown in FIG. 7, the input sensitivity is set for a frequency region in step $S_3$, that is, the gain of the variable gain amplifier 16 is determined so that the input level of the AD converter 18 becomes optimal for its AD converting operation. The thus determined gain, i.e. the input level range $R_1$ for the lowest frequency region is stored in an area 77 of the RAM 64. After such sensitivity setting, the FFT processor 68 analyzes, in step $S_4$, data input at that set sensitivity, i.e. in the level range $R_1$ read out from the RAM 64. The input and output test signal data $X_{a1}$ and $X_{b1}$ are stored in an input data area 78 of the RAM 64. Based on the set of data $X_{a1}$ and $X_{b1}$, power spectra Gaa1 and Gbb1 and cross spectrum Gab1 are obtained by the FFT analysis and stored in a spectrum area 79. This FFT analysis is repeated new set of data $X_{a1}$ and $X_{b1}$ and then, average spectra <Gaa1>, <Gbb1>, <Gab1> and average transfer function <Hab1> = <Gab1>/<Gaa1> are computed and stored in an area 81 of the RAM 64. In step $S_5$ the content n of the region counter in the area 72 is incremented by 1, and it is checked in step $S_6$ whether the content n is larger than the number of the divided regions, N, and if not, the process returns to step $S_2$.

That is, in step $S_5$, the content n initially set to 1 is increased to 2, and the FFT analyzer 14 provides to the test signal generator 11 the same data as in the case of n=1 except that the center frequency is set to $3F_c$ correspondingly. Accordingly, in the test signal generator 11, a sine-wave signal of the frequency $3F_c$ is read out of the sine wave memory 38 and is multiplied by the multiple sine-wave signal of the frequencies $F_0$ to $F_1$ from the waveform memory 32, generating a test signal of frequencies $F_1$ to $F_2$ in FIG. 4. For this test signal, also, the sensitivity setting $R_2$ is similarly effected in step $S_3$, and its input and output test signal data $X_{a2}$ and $X_{b2}$ are stored in the area 78 of the RAM 64. Further, the FFT analysis is carried out and the resulting average spectra $<Gaa2>$, $<Gbb2>$ and $<Gab2>$ and average transfer function $<Hab2>$ are stored in the area 79 of the RAM 64 in step $S_4$. Then, the content n of the region counter is incremented by 1 in step $S_5$, and a test signal is produced for the next frequency region, by which a similar measurement is done. When measurement for the last frequency region $F_{N-1}$ to $F_N$ is thus completed and the content n of the region counter 73 is incremented by 1 in step $S_5$, the content n is larger than N, thus completing the measurement.

Figure 10:
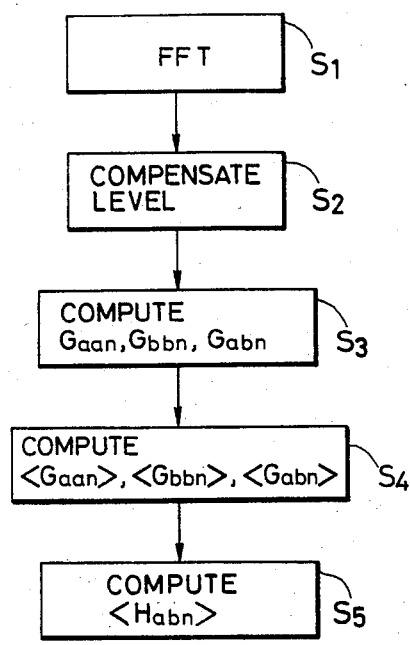
FIG. 10 is a flowchart showing the operation of the FFT analyzer.

Since the frequency range for measurement is divided into a plurality of regions in each of which the sensitivity setting is done, a level correction is needed for displaying the results of analysis over the entire frequency range $F_0$ to $F_N$. To this end, the FFT analyzing process in step $S_4$ in FIG. 8 is carried out in such a manner as shown in FIG. 10. That is, the FFT analysis is effected in step $S_1$ and the result of analysis is corrected in magnitude in step $S_2$. This correction is made, for example, on the basis of the level range $R_n$ set for the nth frequency region $F_{n-1}$ to $F_n$. Namely, if the gain has been selected for the output test signal data $X_{bn}$ in the nth frequency region to be larger, for instance, by 10 db, than the gain for the first frequency region $F_0$ to $F_1$, the magnitudes of the FFT analysis data at the respective frequency components in the nth frequency region are decreased by 10 db. Conversely, in the case of the gain of the variable gain amplifier 16 being decreased by 10 db, the magnitudes of the FFT analysis data for the output test signal data $X_{bn}$ are increased by 10 db. Thereafter, in step $S_3$, the power spectra Gaan and Gbbn and the cross spectrum Gabn are computed for each frequency component in the nth frequency region. The sequence of steps $S_1$, $S_2$ and $S_3$ is repeated for successive sets of data $X_{an}$ a and $X_{bn}$ predetermined number of times designated in an area 76 of the RAM 64 to, obtain a predetermined number of each of the spectra Gaan, Gbbn and, Gabn, and then, the predetermined number of each of the power spectra Gaan and Gbbn and cross spectra Gabn thus obtained for each frequency component in the nth frequency region are respectively averaged in step $S_4$. That is, the average power spectra $<Gaan>$ and $<Gbbn>$ and the average cross spectra $<Gabn>$ are calculated by the CPU 62. From these average spectra is calculated $<Gabn>/<Gaan>$ for the corresponding frequency component in step $S_5$, thus obtaining a transfer function $<Habn>$. These average spectra and the transfer function are stored in the area 81 of the RAM 64 and displayed on the display 65.

The test signal which is generated by the test signal generator for each band is not limited specifically to the multiple sine-wave signal but may also be a noise signal of a frequency-swept sine-wave signal, or a single sine-wave signal. In the case of the single sine-wave signal, data for the generation of the test signal is provided from the FFT analyzer 14 to the test signal generator 11 for each frequency, and the sensitivity setting in step $S_3$ in FIG. 8 may be carried out for each frequency region. The present invention is applicable not only to measurement of a transfer function but also to measurement of a power spectrum, a correlation function, an autocorrelation function and so forth.

Figure 11:
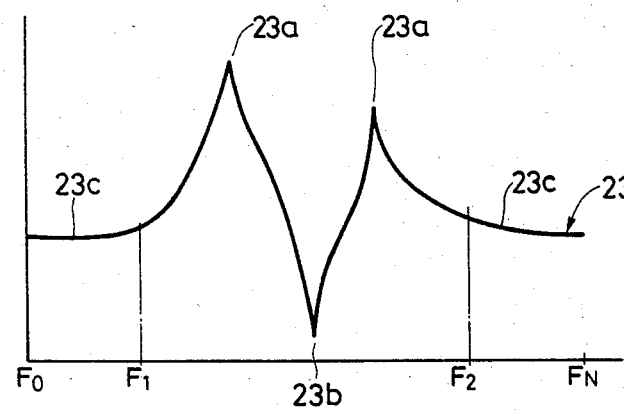
FIG. 11 is a graph showing example of the characteristic of the transfer function which varies abruptly.

In such a transfer function as shown in FIG. 11, there are resonance points 23a and an anti-resonance point 23b in the intermediate portion on the frequency axis, and the transfer function characteristic curve 23 undergoes abrupt changes at these points. At such points measurement of the transfer function by the use of a random noise is particularly inaccurate, and the waveform at the resonance points becomes dull. It has been found, however, that in a portion 23c which undergoes relatively gradual variations, measurement of the transfer function even by the random noise can be achieved with a relatively high degree of accuracy.

Therefore, according to the present invention which measures the transfer function for each frequency region in the frequency range for measurement, it is possible to perform the measurement with a high degree of accuracy and in a relatively short time in the case where the transfer function characteristic includes both abrupt and gentle changes relative to the frequency axis.

Figure 12:
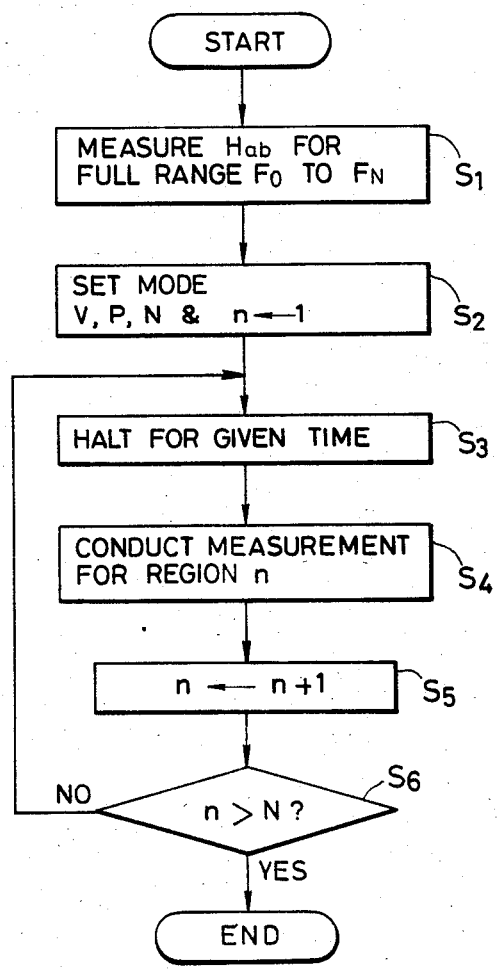
FIG. 12 is a flowchart showing an example of an operation fit for the characteristic shown in FIG. 11.
Figure 13:
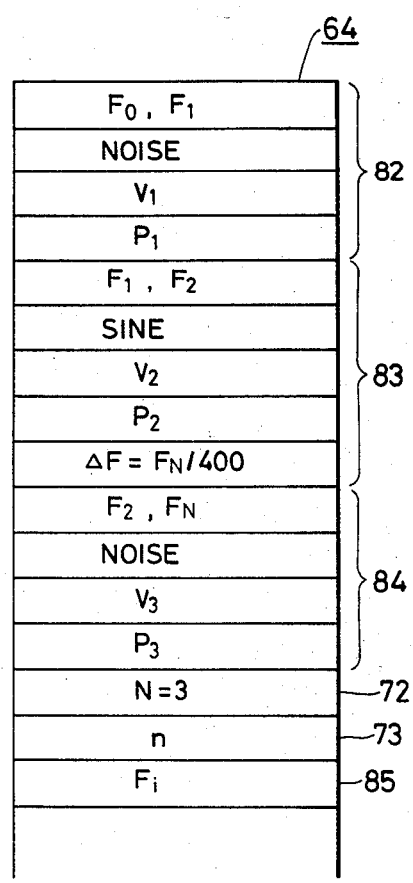
FIG. 13 is a diagram showing an example of the setting of a test signal for each frequency region.

The entire operation of the device in such a case is carried out in such a manner as shown in FIG. 12. In step $S_1$, the frequency band $F_0$ to $F_N$ for measurement, the signal mode (for designation of noise or multiple sine wave) and the signal level are provided, as the test signal data, to the test signal generator 11 from the FFT analyzer 14, by which a noise or multiple sine-wave signal for the entire frequency band $F_0$ to $F_N$ is applied to the device under test 12 to perform the FFT analysis, measuring its transfer function Hab. Then a rough transfer function characteristic thus obtained is displayed on the display 65. The transfer function characteristic curve is separated into a portion of an abrupt change with respect to frequency and a portion of a gentle change. For instance, the transfer function characteristic curve is divided into a first region $F_0$-$F_1$ which does not include any resonance or anti-resonance point, a second region $F_1$-$F_2$ which includes the resonance points 23a and the anti-resonance point 23b and a third region $F_2$-$F_N$ which does not include any resonance or anti-resonance point. As the test signals for the first to third regions, a noise signal is generated for each of the first and third regions $F_0$-$F_1$ and $F_2$-$F_N$ and a single sine-wave signal for the second region $F_1$-$F_2$, as shown in areas 82 to 84 of the RAM 64 in FIG. 13. The amplitudes of the test signals for the first to third regions are represented by $V_1$, $V_2$ and $V_3$, respectively, and the numbers of measurement by $P_1$, $P_2$ and $P_3$, respectively. The frequency variation width $\Delta F$ of the sine-wave signal for the second region is selected $F_N/400$, where 400 is the number of spectra for analysis by the FFT analyzer 21. Such test data, that is, the minimum and maximum frequencies, the signal waveform, the amplitude, the number of measurement and, if necessary, the frequency variation width, are sequentially entered, for each region, from the keyboard 66 into the FFT analyzer 14 for storage in the RAM 64. The number of frequency regions divided, $N=3$, is stored in the area 72, and the content n of the region counter in the area 73 is set to a 1. After a certain elapsed time, for example, 0.5 to 1 minute, for avoiding the influence by the previous measurement in step $S_3$, the process proceeds to step $S_4$, in which a test is made for the specified region (n=1), that is, for the frequency region $F_0$-$F_1$. Thereafter, the content n of the region counter is incremented by 1 in step $S_5$, and it is checked in step $S_6$ whether the content n is larger than the number of regions (N=3). If not, the process returns to step $S_3$, and after a certain elapsed time, measurement for the next specified region, that is, the frequency region $F_1$-$F_2$, is performed.

Figure 14:
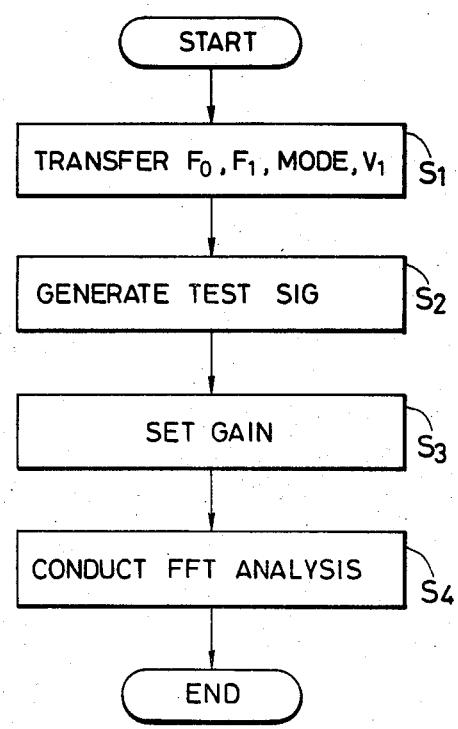
FIG. 14 is a flowchart showing an example of an operation in a region between frequencies $F_0$ and $F_1$.

In the case of measurement for the specified region n=1 by the use of a noise signal in the above mentioned step 4, required test data, that is, the lowest frequency $F_0$, the highest frequency $F_1$, the noise signal waveform and the amplitude $V_1$, are read out of the area 82 of the RAM 64 in the FFT analyzer 14 and provided to the test signal generator 11 in step $S_1$ as shown in FIG. 14. In step $S_2$, the test signal generator 11 changes over the switch 33 in FIG. 5 to the side of the noise signal source 40. By noise pulses which are produced at random, the waveform memory 32 is read out, and its output is provided via the DA converter 34 and the switch 35 to the level adjuster 36, wherein its amplitude is set to $V_1$, and the test signal is output therefrom. The switch 39 is held OFF.

Figure 15:
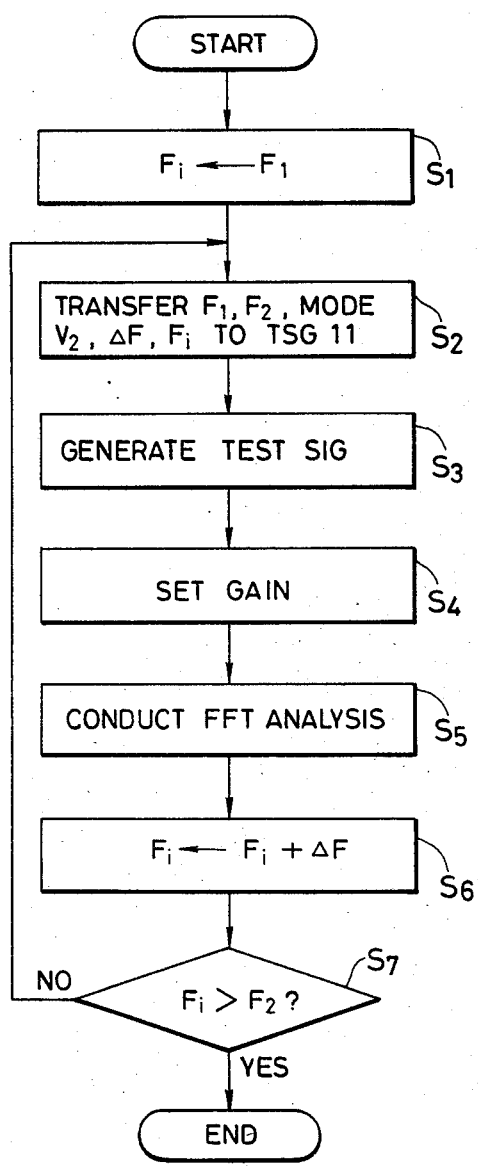
FIG. 15 is a flowchart showing an example of an operation in a region between frequencies $F_1$ and $F_2$.

Upon reception of the test signal, the FFT analyzer 14 controls the gain of the variable gain amplifier 16 to set the input level of the AD converter 18 in such a manner that its conversion characteristic become optimal, (step $S_3$) as referred to previously in connection with FIGS. 6 and 7. In step $S_4$ the input signal is subjected to the FFT analysis at the above set level. This measurement is repeated $P_1$ times and their results are averaged, as mentioned previously. After completion of such measurement for one specified region, measurement for the next specified region, i.e. the region $F_1$-$F_2$, is initiated, but in this case, the measurement is carried out in such a manner, for example, as shown in FIG. 15.

In step $S_1$ the frequency $F_i$ to be generated is set to the lowest frequency $F_1$ in the area 85 of the RAM 64 from the area 83 of which are read out such test data as the lowest frequency $F_1$, the highest frequency $F_2$, the single sine wave, the amplitude $V_2$, the number of measurement $P_2$ and the frequency variation width $\Delta F = F_N/400$. In step $S_2$ test signal data such as the frequency $F_i = F_1$, the single sine wave and the amplitude $V_2$ are transferred to the test signal generator 11. On the basis of these test signal data, a test signal is produced by the test signal generator 11 in step $S_3$. In this case, the switch 39 in FIG. 5 is turned ON and the switch 35 is changed over to the side of the switch 39. The frequency setting register 38s is set so that the frequency $F_i = F_1$ is read out of the waveform memory 38. In step $S_4$ level setting is performed on the basis of the test signal of the sine wave having the frequency $F_1$. In step $S_5$ an FFT analysis is effected for the sine wave of the frequency $F_1$. In step $S_7$ $\Delta F$ is added to the frequency $F_i$. In step $S_7$ it is checked whether this frequency $F_i$ is higher than the highest frequency $F_2$ of the specified region. If so, the process returns to step $S_2$, in which test signal data of the sine-wave signal of the frequency $F_1 + \Delta F$ and the amplitude $V_1$ are transferred to the test signal generator 11, generating therefrom the sine-wave signal of the frequency $F_1 + \Delta F$. In this way, sine-wave signals the frequencies of which increase by steps of $\Delta F$ in a sequential order are produced, and at the same time, the sensitivity range for optimum sensitivity setting is effected for each generation of such a sine-wave signal and the FFT analysis is performed. The analysis is repeated at the above set optimum level by the preset number of measurements $P_2$, and the resulting power spectra and the cross spectra are averaged, respectively. When the frequency $F_i$ of the single sine wave generated exceeds the highest frequency $F_2$ of the specified region, the test therefor by the single sine wave is finished. This measurement for the region $F_1$ to $F_2$ is equivalent to such measurement in which this region is subdivided at intervals of $\Delta F = F_N/400$ (where 400 is the number of analysis line spectra over the entire frequency range for measurement) and a single sine wave of a frequency equal to the center frequency of each sub-divided region is used as a test signal.

Figure 16:
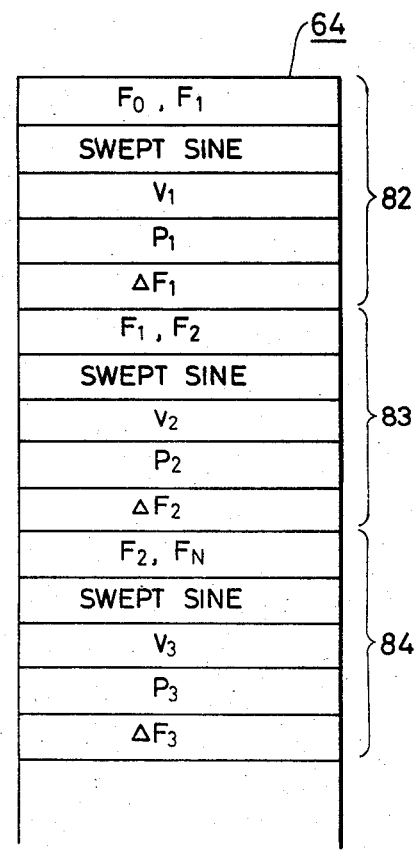
FIG. 16 is a diagram showing another example of the allotment of test signals to respective regions.
Figure 17:
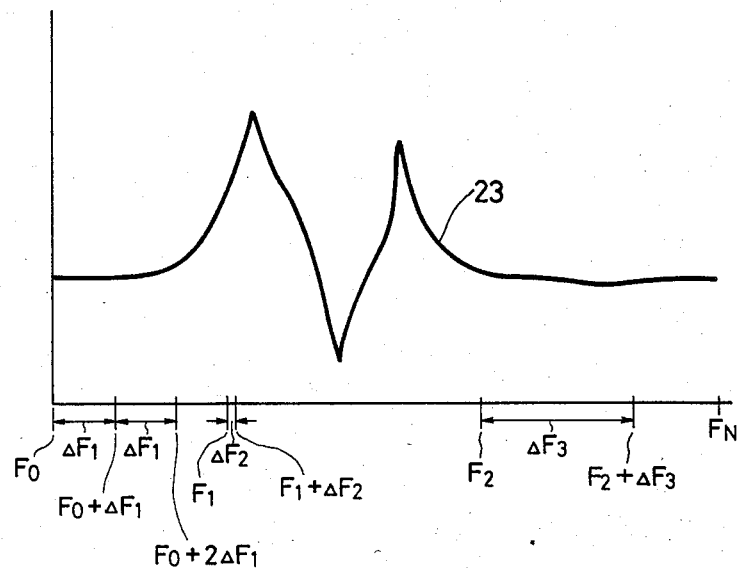
FIG. 17 is a graph showing the relationship between each region and a sweep frequency in each of the test signals in FIG. 16.

In this example, measurement of the region $F_2$-$F_N$ takes place next, and this measurement is carried out by the same operation as shown in FIG. 14. As test signals for respective regions of the frequency range for measurement, for example, in the case of FIG. 11, a frequency-swept sine-wave signal can be used for each of the regions $F_0$-$F_1$ and $F_2$-$F_N$. Also it is possible to employ frequency-swept sine-wave signals for all the regions. For example, as shown in FIGS. 16 and 17, in the region $F_0$-$F_1$, a signal is produced for measurement which sweeps frequency for $\Delta F_1 = 40$ Hz and then a sine-wave signal is produced for measurement which sweeps frequency within a range from $F_0 \Delta F_1$ to $F_0 + 2\Delta F_1$, and thereafter similar signals are produced. For the region $F_1$-$F_2$, sweep signals of a small sweep width $\Delta F_2$, for instance, about 4 Hz, are sequentially produced, and for the region $F_2$-$F_N$, signals of a large sweep width $\Delta F_3$ of 100 Hz are produced. In other words, the regions $F_0$-$F_1$, $F_1$-$F_2$ and $F_2$-$F_3$ are subdivided at intervals $\Delta F_1 = 40$ Hz, $\Delta F_2 = 4$ Hz and $\Delta F_3 = 100$ Hz, respectively, and these subdivided regions are each measured by a frequency-swept signal. It is also possible that measurement is effected first by a noise signal or multiple sine wave for the entire range of measurement and then measurement is performed by a single sine wave or low-speed frequency-swept signal for only a range of abrupt variations of the transfer characteristic, for example, for the region $F_1$-$F_2$ in the above, and the measured data of that portion is used in place of the corresponding portion of the data previously obtained by the use of the multiple sine wave or noise signal.

Since the frequency components obtained by the fast Fourier transform are equally spaced, the measurement spectra in the vicinity of the high frequency $F_N$ are relatively closely spaced, whereas the spectrum density in the vicinity of the low frequency $F_0$ is low with respect to it. Therefore, when a peak 23a exists in the lower frequency region, as shown in FIG. 18, resolution at the peak portion drops.

According to the present invention which performs measurement for each of the frequency regions into which the frequency range of measurement is divided, measurement can be effected at substantially equal frequency intervals, that is, resolution can be obtained at substantially equal frequency intervals on a logarithmic scale.

In this case, the frequency range of the input signal to be analyzed is divided into a plurality of regions, and the lower the frequency region is, the lower the sampling frequency of the AD converter is set. By this, the ratio of the spacing of spectra to frequency becomes substantially constant in both low and high frequency regions, providing the results of analysis of uniform resolution. In the case of dividing the frequency range, it is preferable to control the input level of the AD converter so that it performs an optimum conversion for each region.

Figure 18:
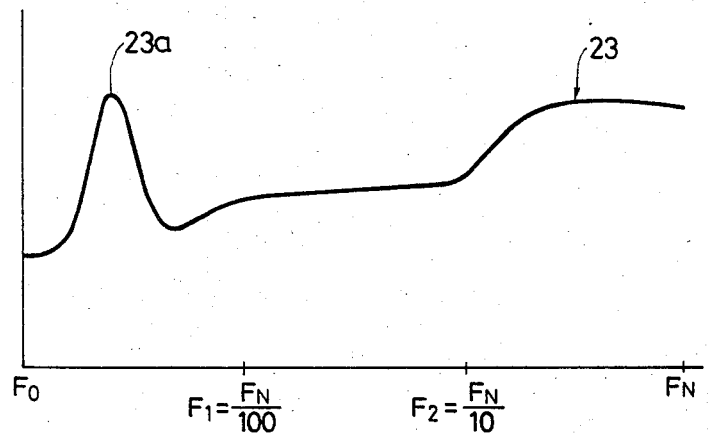
FIG. 18 is a graph showing an example of a transfer function which has a sharp characteristic in a low-frequency region.
Figure 19:
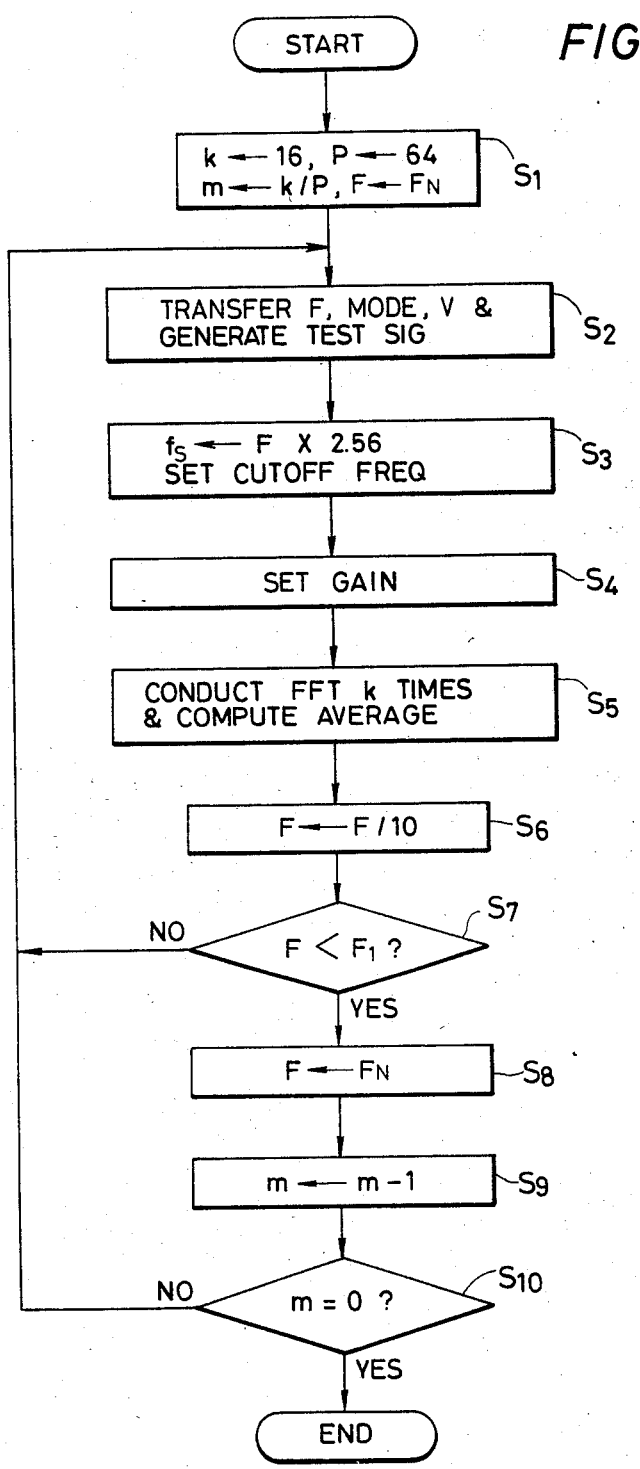
FIG. 19 is a flowchart showing an example of an operation fit for an analysis of the characteristic shown in FIG. 18.

For example, in the case of a frequency analysis in FIG. 18, the frequency range $F_0$ to $F_1$ is divided into three regions, i.e. a first region between the highest frequency $F_N$ and a frequency $F_2$ which is 1/10 of the former, a second region between the frequency $F_2$ and a frequency $F_1$ which is 1/10 of the former, that is, 1/100 of the highest frequency $F_N$, and a third region of lower frequency. The entire operation in this case is shown in FIG. 19. In this example, measurement is carried out a plurality of times for each frequency to be analyzed. At first, the highest frequency $F_N$, the number of measurements P, the waveform and the amplitude V are stored in the RAM 64 from the keyboard 66. In step $S_1$ the highest frequency $F_N$ is set to F, m is defined to be a value obtained by dividing the number of measurements P by k, which is set to, for example, 16. When the number of measurements P is 64, m=64/16=4. In step $S_2$ test signal data, that is, the highest frequency F, the mode (waveform) indicating the test signal to be generated and the amplitude V of the test signal, are transferred to the test signal generator 11. The test signal generator 11 produces a test signal of the mode being set. For example, in the case of a noise signal, the switch 33 is changed over to the side of the noise source 40 and the switch 35 is changed over to the side of the DA converter 34, and a noise read out of the waveform memory 32 is set at the amplitude V and output.

On the other hand, the sampling frequency fs of the AD converter 18 is set to a value at least two times, for example, 2.56 times, larger than the frequency F. Further, in this example, the cutoff frequency of the low-pass filter 17 is also set to such a cutoff characteristic that the filter permits the passage therethrough of a signal of the frequency F to be analyzed but inhibits the passage of signals of higher frequencies. The above sampling frequency and cutoff frequency are set by the setting of the sampling frequency setting register 18s and the cutoff frequency setting register 17s in FIG. 6.

In step $S_4$ the sensitivity setting is performed as required. That is, the gain of the variable gain amplifier 16 is set so that the converting operation of the AD converter 18 is optimal, as described previously with regard to FIGS. 6 and 7. In step $S_5$ the test signal generator 11 set in such a state as described above generates a signal in the frequency range of between $F_2$ and $F_N$, which signal is subjected to the fast Fourier transform, obtaining, for example, 400 line spectra. The fast Fourier transform of the signal is repeated k times and the results are averaged for each frequency component.

In step $S_6$ the frequency F is reduced down to 1/10, and it is checked in step $S_7$ whether the frequency F is lower than the highest frequency in the lowest frequency region, that is, the frequency $F_1$ in the region $F_0-F_1$, and if not, the process returns to step $S_2$. Accordingly, in this case, an analysis for the region $F_1-F_2$ in FIG. 4 is carried out, and the corresponding test signal is produced by the test signal generator 11. Further, in step $S_3$ a sampling frequency 2.56 times higher than the frequency $F_2$ is set for the AD converter 18, and the cutoff frequency of the filter 17 is also set correspondingly. In a likewise manner, an optimum sensitivity for the new test signal is also set, and the new test signal is subjected to the fast Fourier transform to obtain 400 line spectra. This transform is similarly repeated k times, and the results are averaged together with all the data obtained so far for the corresponding frequency region.

Upon completion of measurement for the frequency region between $F_0$ and $F_1$ after measurement for the regions between $F_N$ and $F_N/10$ and between $F_N/10$ and $F_N/100$, the frequency F becomes lower than the frequency $F_1$ in step $S_7$. In step $S_8$ the frequency F is set to the highest frequency $F_N$ of the measurement range, and in step $S_9$ m is decremented by 1. In step $S_{10}$ it is checked whether m is 0, and if not, the process returns to step $S_2$. That is, k sets of samples are obtained for each of the aforesaid three regions and subjected to the FFT analysis, and the results obtained are averaged, after which k sets of samples are obtained again for each frequency region and subjected to the FFT analysis, and if m is 0, the process is finished. It is also possible to perform measurement for each region by the preset number of measurement P and to finish the process if the frequency is lower than the frequency $F_1$ in step $S_7$. By measuring k times and displaying the measured results each time they are averaged together with all the data obtained so far in step $S_5$, as shown in FIG. 19, a general characteristic can be known in an early stage.

Also in FIGS. 14, 15 and 19, when the frequency range of measurement is displayed, as a whole, for the setting of the optimum sensitivity upon each occurrence of the test signal, it is necessary to correct the measured results, as described previously in respect of FIG. 10. In the measurement shown in FIGS. 14, 15 and 19, the sensitivity setting is not always required. Also in the measurement shown in FIGS. 8 and 12, it is possible to repeat the process of measuring a plurality of times for each region, averaging the measured results, again measuring for each region and averaging the measured results, as referred to previously in connection with FIG. 19. In the measurement of a transfer function, if regions of abrupt and gentle changes of the transfer function are preknown, the operation may start with measurement for each region without performing the measurement for the entire frequency range of measurement.

As has been described in the foregoing, according to the present invention, the frequency range of measurement is divided into a plurality of frequency regions, for each of which a test signal is generated, and sensitivity, i.e. gain is set for each region. Accordingly, in the case of the measurement of the transfer function, for example, as shown in FIG. 4, the sensitivity is lowered for the low-frequency region of high level, that is, the gain of the variable gain amplifier 16 is stepped down, thereby making the best use of the AD converter 18 within such a range that it does not overflow. In the high-frequency region of low level in FIG. 4, the gain of the variable gain amplifier 16 is stepped up by which the AD converter 18 is made to effectively provide data in its conversion output bits, for instance, 12 bits. Thus, even in the case where the level difference by frequency components is large over the entire frequency range of measurement, that is, even when the level dynamic range is large, correct and accurate measurement can be achieved.

As described previously with respect to FIG. 8, by roughly measuring for the entire frequency range first and by measuring for the region in which the transfer function abruptly changes, through the use of a single sine-wave signal or low-speed frequency-swept signal, highly accurate measurement can be effected. In addition, in the region in which the transfer function undergoes relatively gentle changes, measurement can be achieved with high accuracy and in a short time by the use of a noise signal, multiple sine-wave signal or high-speed sweep signal. Accordingly, high-accuracy measurement can be performed in a short time as a whole.

In such measurement as described in connection with FIG. 19, the frequency range of measurement is divided into a plurality of regions, and the lower the frequency of the region is, the lower the sampling rate of the AD converter is selected. Consequently, the line spectra obtained by the fast Fourier transform become closely spaced with a decrease in frequency, so that resolution for frequency becomes substantially constant. Especially, in the case where the low-frequency region includes a portion of an abrupt change in spectrum, the change can be measured with high accuracy, permitting correct analysis of it.

It will be apparent that many modifications and variations may be effected without departing from the scope of the novel concepts of the present invention.

What is claimed is:

1. An apparatus for determining the transfer function of a device under test, based on the output of the device in response to a test signal input thereto, said apparatus comprising generating means for generating test signals over a frequency range for said test and for supplying same to said device under test, and transform means for performing Fourier transformation of said output of said device, including an analog-to-digital converter having a dynamic range which receives the signal to be Fourier transformed, wherein said generating means and transform means include means for dividing said frequency range for said test into a plurality of frequency regions, for generating at respective successive times respective ones of said test signals for respective ones of said frequency regions, for adjusting a respective gain level for the test signal supplied to said analog-to-digital converter for each said frequency region in correspondence to said dynamic range, and for successively performing said Fourier transformation of the respective outputs of said device for said test signals of the respective frequency regions.

2. The apparatus of claim 1, said generating means and transform means including means for determining the transfer function of said device over said frequency range for said test, based on the respective gain level and the respective Fourier transformation of said output of said device for each said frequency region.

3. The apparatus of claim 2, wherein said transfer function over said frequency range includes slowly and rapidly varying portions, as a function of frequency, and the widths of said frequency regions are correspondingly determined in respective ones of said slowly and rapidly varying portions.

4. The apparatus of claim 2, wherein said frequency regions have equal width, and said test signals for the frequency regions are all of the same type.

5. The apparatus of claim 3, wherein said test signal for each of said frequency regions corresponding to each said slowly varying portion of the transfer function is a wide-band test signal covering the respective frequency region.

6. The apparatus of claim 3, wherein said test signal for each of said frequency regions corresponding to each said rapidly varying portion of the transfer function is a sine-wave of frequency within the respective frequency region.

7. The apparatus of claim 3, wherein said test signal for each said frequency region corresponding to each said rapidly varying portion of the transfer function is a sine-wave signal that is frequency swept over the respective frequency region.

8. The apparatus of claim 3, wherein said test signal for each of said frequency regions corresponding to each said slowly-varying portion of the transfer function is a plurality of sine-wave signals of respective frequencies spread over the respective frequency region.

9. The apparatus of claim 3, wherein the respective test signal in each of the frequency regions is a sine-wave that is frequency swept over the respective region.

10. The apparatus of claim 3, wherein, in the frequency regions corresponding to said slower-varying portions of and the transfer function, the widths of the respective frequency regions increase with frequency.

11. The apparatus fo claim 1, wherein said transform means takes the Fourier transform of each respective test signal, the cross spectrum is calculated for each said frequency region as the product of the Fourier transform of the Fourier transform of the respective test signal and the conjugate of the respective output signal from the device, for providing the transfer function over said frequency range.

12. The apparatus of claim 11, wherein said test pattern for each said frequency region is repeated, and the average of the respective Fourier transforms are taken for providing said transfer function.

13. The apparatus of claim 11, wherein said transform means includes means for detecting when any part of the respective output signal of the device corresponding to any of the frequency regions exceeds said dynamic range of the analog-to-digital converter and for resetting said gain for conformance with said dynamic range.

* * * * *

UNITED STATES PATENT AND TRADEMARK OFFICE
CERTIFICATE OF CORRECTION

PATENT NO. : 4,607,216

DATED : August 19, 1986

INVENTOR(S) : Yamaguchi et al

It is certified that error appears in the above-identified patent and that said Letters Patent is hereby corrected as shown below:

Column 3, line 50 delete "the".

Column 7, line 12, "mcdified" should be --modified--;
line 61, "p" should be --P--.

Column 8, line 47, after "repeated" insert --a predetermined number of times for each--.

Column 9, line 36, delete "a";
line 36, after "$X_{bn}$" insert --a--;
line 39, "and," (first occurrence) should be --and--;
line 39, "and" (second occurrence) should be --and,--.

Column 12, line 15, "$F_0 \ \Delta F_1$" should be --$F_0 + \Delta F_1$--.

Signed and Sealed this

Eighteenth Day of November, 1986

*Attest:*

DONALD J. QUIGG

*Attesting Officer*     *Commissioner of Patents and Trademarks*